United States Patent [19]

Takada

[11] Patent Number: 4,985,367
[45] Date of Patent: Jan. 15, 1991

[54] METHOD OF MANUFACTURING A LATERAL TRANSISTOR

[75] Inventor: Hideki Takada, Mountain View, Calif.

[73] Assignee: Kabushiki Kaisha Toshiba, Kawasaki, Japan

[21] Appl. No.: 379,675

[22] Filed: Jul. 11, 1989

Related U.S. Application Data

[63] Continuation of Ser. No. 170,663, Mar. 7, 1988, abandoned, which is a continuation of Ser. No. 889,737, Jul. 28, 1986, abandoned.

[30] Foreign Application Priority Data

Sep. 2, 1985 [JP] Japan ............................. 60-193479

[51] Int. Cl.⁵ .......................................... H01L 21/265
[52] U.S. Cl. ..................................... 437/32; 437/228; 437/235; 437/924; 357/35; 148/DIG. 10; 156/653; 156/657
[58] Field of Search ..................... 437/31, 32, 33, 225, 437/228, 233, 235, 193, 189, 195, 187, 924; 148/DIG. 10, DIG. 11; 357/35, 99 H; 156/653, 657

[56] References Cited

U.S. PATENT DOCUMENTS

| | | | |
|---|---|---|---|
| 3,609,473 | 9/1971 | Bittmann | 397/35 |
| 3,651,565 | 3/1972 | Talbert | 357/35 |
| 4,131,908 | 12/1978 | Daub et al. | 357/35 |
| 4,287,660 | 9/1981 | Nicholas | |
| 4,392,149 | 5/1983 | Horng | |
| 4,443,931 | 4/1984 | Baliga et al. | |
| 4,546,536 | 10/1985 | Anantha et al. | 437/32 |
| 4,669,177 | 6/1987 | D'Arrigo | 437/59 |

FOREIGN PATENT DOCUMENTS 3023616 1/1981 Fed. Rep. of Germany .

OTHER PUBLICATIONS

Yang, "Fundamentals of Semiconductor Devices", McGraw-Hill, 1978, pp. 73–77.

Primary Examiner—Brian E. Hearn
Assistant Examiner—Tuan Nguyen
Attorney, Agent, or Firm—Finnegan, Henderson, Farabow, Garrett, and Dunner

[57] ABSTRACT

A method of manufacturing a lateral transistor which comprises the steps of forming N type semiconductor silicon layer on P type semiconductor substrate, depositing base region on part of the semiconductor silicon layer, forming field oxide layer bearing an opening on the base region, forming thin insulation layer on that part of the semiconductor body which is exposed by the opening, forming an annular pattern on the thin insulation layer, implanting a P type impurity in the base region, thereby providing an emitter region and collector region in the self-aligned fashion with respect to the annular pattern, retaining the annular pattern, and depositing insulation layer on the resultant structure, boring an emitter contact hole having a smaller diameter than the outer diameter of the annular pattern, and forming emitter contact hole in the self-aligned fashion with respect to the annular pattern, and forming emitter electrode in contact with the emitter region through the contact hole.

18 Claims, 4 Drawing Sheets

F I G. 2
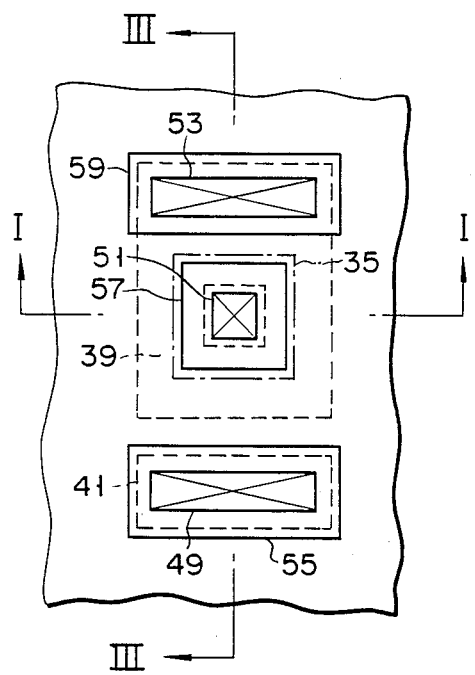
F I G. 3
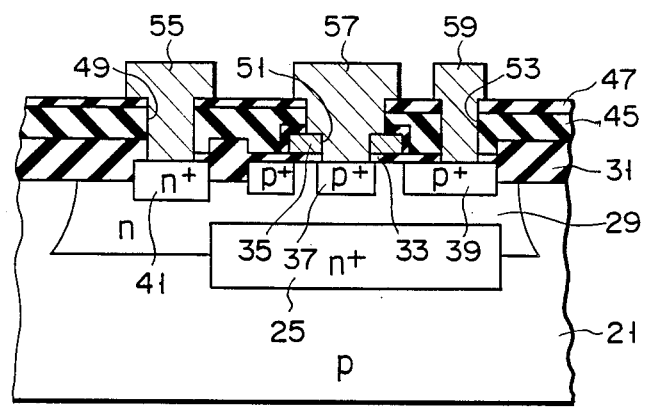

METHOD OF MANUFACTURING A LATERAL TRANSISTOR

This application is a continuation of application Ser. No. 170,663, filed Mar. 7, 1988 which is a continuation of application Ser. No. 889,737, filed July 28, 1986, both abandoned.

BACKGROUND OF THE INVENTION

This invention relates to an improvement on the method of manufacturing a lateral transistor. A lateral PNP transistor has been produced, for example, by the following steps. First, an N type silicon layer is deposited on a P type semiconductor substrate. The N type silicon layer is divided into a plurality of N type islands by a P type element-isolating region. A thick oxide layer is mounted on part of an element-isolating region and an island. A thin oxide layer is laid in that part of the island on which the silicon layer is exposed. An annular resist pattern is deposited on the thin oxide layer.

A P type impurity is ion implanted into an N type base region through the thin oxide layer. At this time, the resist pattern is used as a mark. The resist pattern is removed. The implanted ion is activated. As a result, an emitter region is formed on that part of the silicon layer which corresponds to the hollow portion of the annular resist pattern. At this time, an annular collector region is formed on that part of the silicon layer which is defined between the outer peripheral wall of the resist pattern and the inner peripheral wall of the thick oxide layer. As a result, an annular region lying between the emitter and collector regions is converted into a base region. A resist pattern is mounted on the thin oxide layer. The resist pattern has an opening formed in that part thereof which faces the part in which a bare leadout region is to be formed. An N type impurity is ion implanted into a silicon layer (base region) through a thin oxide layer with the resist pattern used as a mask. The resist pattern is removed. As a result, the implanted ion is activated to provide a base electrode leadout region.

A CVD-SiO$_2$ layer is deposited over the whole surface of the resultant structure. The CVD-SiO$_2$ layer and thin oxide layer are selectively etched. This etching process provides a base electrode leadout contact hole, an emitter electrode leadout contact hole, and a collector electrode leadout contact hole. An aluminium layer is deposited over the whole surface of the resultant structure. The aluminium layer is patterned, thereby providing a base electrode, an emitter electrode and a collector electrode. These electrodes are connected to the corresponding base electrode leadout region, emitter electrode leadout region, and collector electrode leadout region. Hitherto a lateral PNP transistor has generally been fabricated in the above-mentioned manner. One of such manufacturing methods is disclosed, for example, in Japanese patent publication No. Sho 41-5656 (priority claim No. 284611 filed in U.S.A. on May 31, 1963).

With the lateral type PNP transistor, the magnitude of collector electrode is proportional to the effective area of the emitter region. In other words, the magnitude of the collector current is proportional to the peripheral length of the emitter region. On the other hand, the base current flows toward the bottom of the emitter region. Therefore, the base current increases with a rise in the area of the emitter region. To elevate current gain (or amplitude), therefore, it is necessary not only to narrow the base width, but to reduce the real area of the emitter region and to enlarge a ratio between the effective area of the emitter region (or its peripheral length) and the real area of the emitter region.

In the above-mentioned lateral transistor-manufacturing method, the deposition of the emitter and collector regions, and the boring of the emitter electrode leadout contact hole are carried out by applying different resist patterns. In the manufacture of the subject lateral transistor, therefore, it is necessary to take into account the difficulties which might occur in matching the different resist patterns used in masks. Now let it be assumed that an annular resist pattern is formed having a small hollow area to provide a small emitter region. In this case, if a resist used for the selective etching of a layer (for example, CVD-SiO$_2$) fails to be masked with high precision, the resultant emitter electrode contact hole will spread over an area including the emitter and base regions. In such case, the emitter and base regions are short circuited by the emitter electrode. To suppress the occurrence of short circuiting between the emitter and base regions, it is necessary to expand the emitter region and provide a sufficient margin for masking. In the conventional method of manufacturing a lateral transistor, therefore, a limitation was imposed on the noticeable dimensional reduction of the area of the emitter region, thus presenting difficulties in dense integration of transistors and the manufacture of a transistor ensuring a high current gain.

SUMMARY OF THE INVENTION

The object of the present invention is to provide a method of manufacturing, for example, a lateral transistor whose emitter region can be noticeably reduced in size.

To attain the above-mentioned object, this invention provides a method of manufacturing a lateral PNP transistor, which comprises the steps of:

providing semiconductor body (29) of first conductivity type (N);

forming annular pattern (35) above the main surface of said semiconductor body (29);

implanting an impurity of second conductivity type into said semiconductor body (29) with said pattern (35) used as a mask, thereby providing first layer (37) of second conductivity type which faces the inside of said annular pattern (35) and second layer (39) of second conductivity type which faces the outside of said annular pattern (35);

depositing insulation layers (45, 47) on the resultant structure with said annular pattern (35) retained; and boring a hole, in said insulation layers (45, 47), in a self-aligned fashion with respect to said annular pattern thereby exposing said first layer (37).

A lateral transistor embodying this invention which is constructed as described above is characterized in that the aforesaid contact hole is provided in the first region (emitter region) in the self-aligned fashion. Therefore, it is unnecessary to provide a masking margin for the formation of the first region as well as the contact hole. Moreover, neither the contact hole extends beyond the boundary of the first region, nor is the semiconductor layer found to be short circuited by each other. Therefore, it is possible to reduce the dimension of the first region, providing a highly integrated lateral transistor possessing a high current amplitude.

BRIEF DESCRIPTION OF THE DRAWINGS

FIG. 2 is a plan view of a lateral transistor manufactured by the method collectively illustrated by FIGS. 1A to 1F;

FIG. 3 is a sectional view on line III—III of the transistor shown in FIG. 2.

DETAILED DESCRIPTION OF THE PREFERRED EMBODIMENT

Figure 1A:
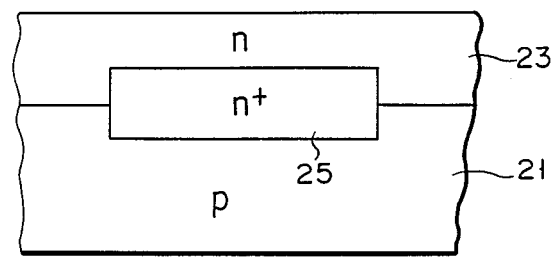
FIGS. 1A to 1F are sectional views showing the sequential steps of manufacturing a lateral transistor embodying this invention.
Figure 1B:
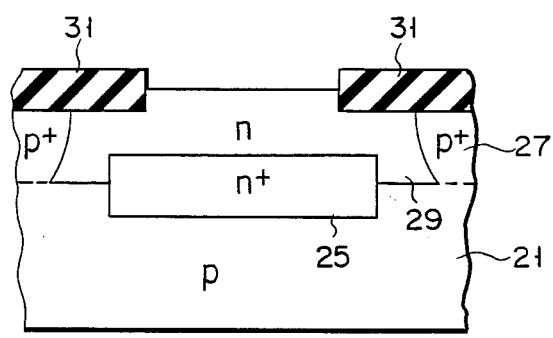
Figure 1C:
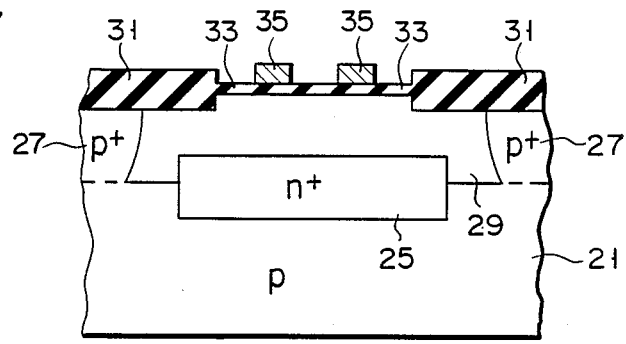
Figure 1D:
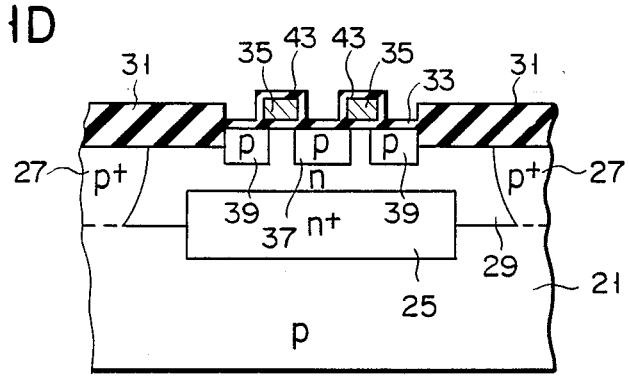
Figure 1E:
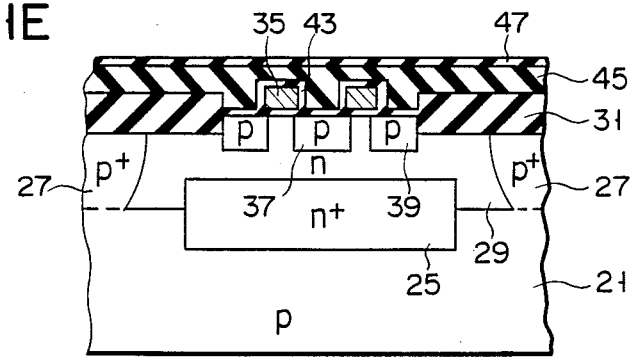
Figure 1F:
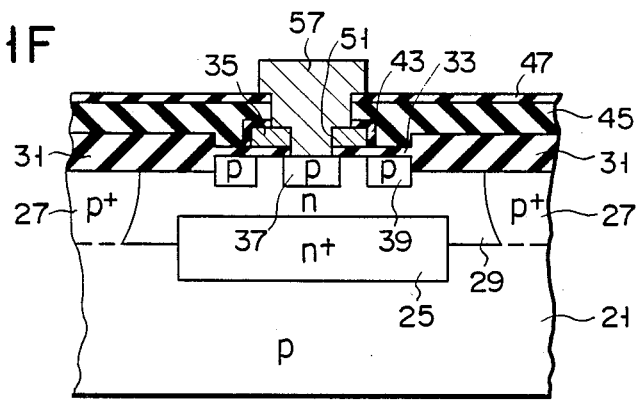

Description may now be made with reference to FIGS. 1A to 1F, 2, and 3 illustrating the method of this invention for manufacturing a lateral PNP transistor. FIGS. 1A to 1E are sectional views showing the sequential steps of manufacturing a PNP lateral transistor embodying this invention. FIGS. 1F and 3 are sectional views of a finished PNP lateral transistor embodying the invention. FIG. 1F corresponds to sectional view on line I—I of FIG. 2. FIG. 3 corresponds to sectional view on line III—III of FIG. 2.

Description may now be made of the sequential steps of manufacturing the subject lateral transistor. First, there is a P type silicon substrate 21 having an impurity concentration of $10^{14}$ to $10^{16}/cm^3$. The main surface of silicon substrate 21 is selectively doped with an N type impurity (for example, antimony) by ion implantation or diffusion. N type silicon layer 23 is opitaxially grown on the main surface of silicon substrate 21. Silicon layer 23 is prepared with an impurity concentration of $10^{14}$ to $10^{16}/cm^3$ and with a thickness of about 1 to 20 microns. In this embodiment, the ion-implanted N type impurity is redistributed through substrate 21. At this time, the N type impurity is also carried into silicon layer 23 by auto doping. An N type embedded layer 25 is formed by the above-mentioned steps. When N type embedded layer 25 completes the function of reducing base resistance, the impurity concentration in layer 25 is at a level ranging between $10^{18}$ and $10^{20}/cm^3$. The structure illustrated in FIG. 1A results from the above-mentioned steps.

A P type impurity (for example, boron) is selectively doped in N type silicon layer 23. The doped impurity is activated to provide P+type element-isolating region 27. This element-isolating region 27 causes island 29, electrically isolated from other elements, to be formed in N type silicon layer 23. Island 29 acts as the base region of the PNP transistor. Therefore, hereinafter island 29 is referred to as "base region 29." Selective oxidation is applied to the surface of the resultant structure, causing field oxide layer 31 having a thickness of 900 nm to be formed on a part of element isolating region 27 and base region 29. Field oxide layer 31 is formed on a region other than that on which emitter and collector regions and base electrode leadout layer are to be formed. The structure illustrated in FIG. 1B results from the aforementioned steps.

Oxide layer 33 is thermally deposited on the exposed portion of base region 29 (that portion of base region 29 which is not covered with field oxide layer 31). Oxide layer 33 is deposited with a thickness of, for example, 50 nm. A polycrystalline silicon layer is deposited over the whole surface of the resultant structure with a thickness of, for example, 350 nm. The polycrystalline layer is patterned to provide annular polycrystalline silicon pattern 35 in oxide layer 33. The structure of FIG. 1C results from the abovementioned steps.

A P type impurity, for example, boron is ion implanted into base region 29 through oxide layer 33 by applying a mask composed of field oxide layer 31, polycrystalline silicon pattern 35 and, if necessary, a resist layer. The ion implantation is carried out under the conditions prescribed, for example, as follows:

Acceleration voltage: 35 kV
Dosage: $2 \times 10^{15}/cm^2$

The implanted P type ion is activated to form P type emitter region 37 and annular P type collector region 39 in base region 29. P type emitter region 37 is deposited in that portion of base region 29 which faces the hollow part of annular pattern 35. Further, annular P type collector region 39 is formed in that portion of base region 29 which is interposed between the outer periphery of annular pattern 35 and the inner periphery of field oxide layer 31. Namely, emitter region 37 and collector region 39 are formed in a self-aligned fashion with respect to annular pattern 35. Oxide layer 33 deposited on that part on which the base electrode leadout region is to be formed is selectively etched to provide an opening. Further, a resist pattern (not shown) is formed. An N type impurity (for example, arsenic) is selectively ion implanted on base region 29.

The aforementioned resist pattern is removed. The resultant structure is subjected to thermal oxidation at a temperature of 900° C. As a result, the implanted ion is activated, and base electrode leadout region 41 (FIG. 3) is formed in base region 29. Further, oxide layer 43 is deposited on annular polycrystalline silicon pattern 35 and the surface of base region 29. The structure of FIG. 1D results from the above-mentioned steps.

CVD-SiO$_2$ layer 45 is spread over the whole surface of the resultant structure. Silicon nitride layer (passivation layer) 47 is deposited on CVD-SiO$_2$ layer 45. The structure of FIG. 1E results from the aforementioned steps.

A resist pattern (not shown) is formed in such a manner that openings are provided on those portions in which contact holes are to be formed to lead out of the emitter electrode, base electrode, and collector electrode. As shown in FIG. 3, the silicon nitride layer 47, CVD-SiO$_2$ layers 45 and oxide layers 33, 43, deposited on base electrode leadout region 41, emitter region 37, and collector region 39, are selectively etched, thereby providing base electrode leadout contact hole 49, emitter electrode leadout contact hole 51, and collector electrode leadout contact hole 53 (FIGS. 2 and 3). It is assumed that a resist mask for the formation of the emitter electrode leadout contact hole 51 is slightly displaced from the original position. Even with such an occasion, the annular silicon pattern 35 acts as an etching mask, thereby giving rise to a small possibility that contact hole 51 is so formed as to overlap base region 29. Namely, the contact hole 51 is formed in a self-aligned fashion with respect to the annular pattern 35. Emitter region 37, too, is formed in a self-aligning fashion with respect to said annular pattern 35. Consequently, contact hole 51 is also formed in a self-aligned fashion with respect to emitter region 37. As a result, emitter region 37 and base region 39 are little likely to be electrically connected together by means of the later described aluminium element. An aluminium layer is deposited over the whole surface of the resultant structure. The aluminium layer is patterned to provide base electrode 55, emitter electrode 57, and collector electrode 59. Base electrode 55, emitter electrode 57, and collector electrode 59 all prepared from aluminium are respectively connected to the corresponding base electrode leadout region 41, emitter region 37, and collector region 39 through contact holes 49, 51, and 53. A lateral PNP transistor whose section is shown in FIG. 1F, whose plan view is given in FIG. 2 and whose particular cross section on line III—III of FIG. 2 is indicated in FIG. 3 is manufactured by the aforementioned steps.

According to the present invention, emitter region 37 and collector region 39 are formed with annular polycrystalline silicon pattern 35 used as a mask. Later, emitter electrode contact hole 51 is formed with annular silicon pattern 35 retained. In this case, annular silicon pattern 35 acts as a second etching mask. Therefore, even if a resist mask for the formation of emitter electrode leadout contact hole 51 should happen to be displaced, the position of contact hole 51 is restricted by annular silicon pattern 35 (FIG. 1). Consequently, a contact hole is prevented from being so formed as to overlap emitter region 37 and base region 29. In other words, the contact hole is formed in a self-aligned fashion on emitter region 37. Should, therefore, the masking of a resist for the formation of a contact hole be displaced within the width of the annular pattern, no difficulties will arise. Consequently, no short circuiting will arise between the base and emitter regions when emitter electrode 57 is formed. Therefore, it is unnecessary to provide a masking margin when emitter region 39 and emitter contact hole 51 are formed, thereby reducing the area of emitter region 37 and ensuring the manufacture of a lateral transistor having a high current amplitude.

If polycrystalline silicon pattern 35 is retained and not electrically connected to any other terminal, polycrystalline silicon pattern 35 will act as a floating gate, tending to give rise to a malfunction of the transistor due to an injection of carriers from the substrate. With a lateral transistor embodying this invention, however, emitter electrode 57 is connected to polycrystalline silicon 35. Pattern 35 is connected to emitter region 37 having a slight voltage difference from base region 29. Therefore, pattern 35 is prevented from acting as a floating gate, thereby suppressing the deterioration of the characteristics of a transistor.

Further, there is the possibility that polycrystalline pattern 35 will act as a gate electrode; the emitter and collector act as a drain or source; and a leak current regions to flow. In such case, the occurrence of a leak current is generally suppressed by causing the emitter to be impressed with a high voltage and the collector to be impressed with a low voltage. Customarily, the adoption of the above-mentioned process ensures a suppression of any problem.

The foregoing embodiment involved the application of two layers, that is, CVD-SiO$_2$ layer 45 and silicon nitride layer 47. However, it is possible in the case of either one. Further, CVD-SiO$_2$ layer 45 need not be exclusively used, but it is possible to apply plasma SiO$_2$ or any other insulation layer.

The foregoing description relates to the case where the present invention is applied to the manufacture of a PNP lateral transistor. However, the invention is also applicable to the manufacture of a NPN lateral transistor.

Figure 4:
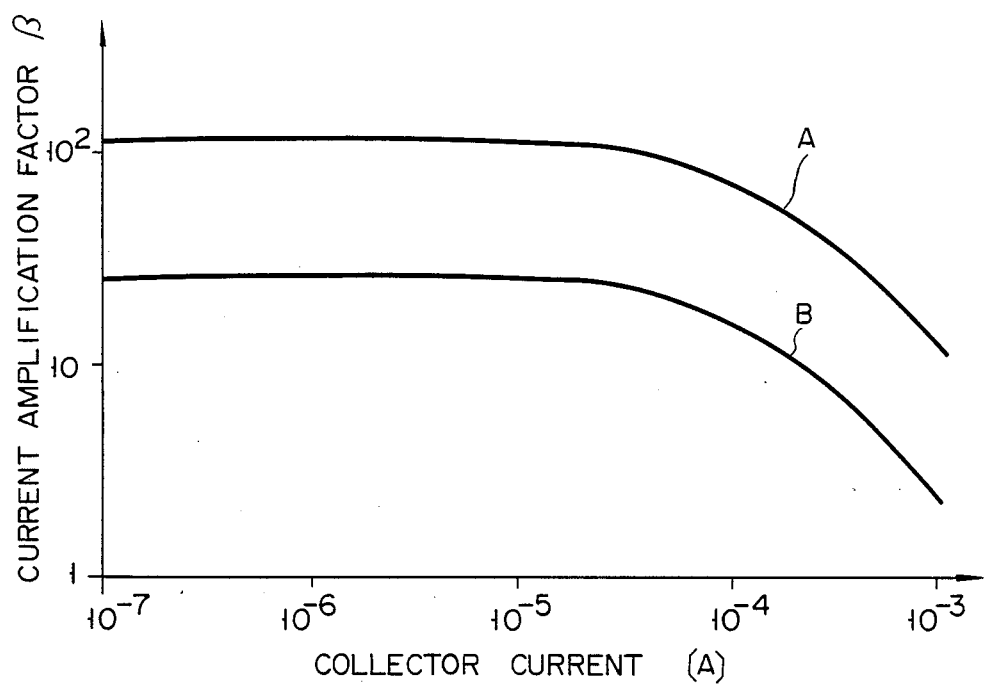
FIGS. 4 and 5 are curve diagrams comparing the properties of a lateral transistor manufactured by the conventional method with the lateral transistor embodying this invention.
Figure 5:
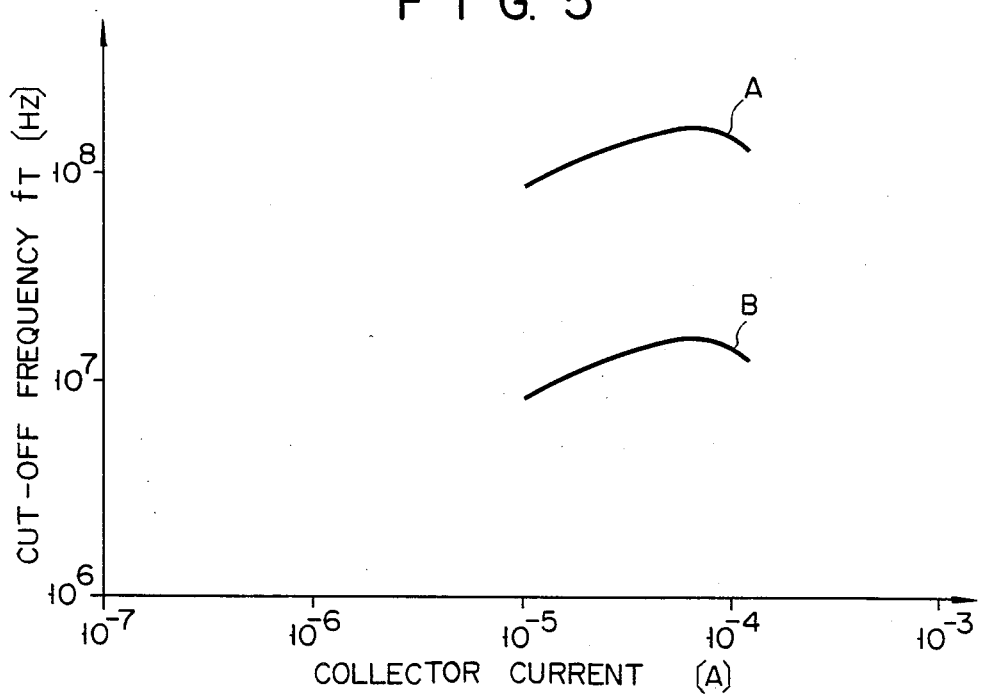

FIGS. 4 and 5 give an experimental comparison between the properties of a lateral transistor manufactured by the present invention and those the conventional lateral transistor. FIG. 4 is a curve diagram indicating the relationship between the current amplitude 8 and collector current [A] observed in the present invention and the conventional lateral transistor. FIG. 5 is a curve diagram showing the relationship between the cutoff frequency fT [Hz] of a transistor and collector current [A] observed in the present invention and conventional lateral transistor. Throughout FIGS. 4 and 5, curve A represents the property of a lateral transistor manufactured by the method of the invention. Curve B denotes the property of a lateral transistor manufactured by the conventional process. FIG. 4 clearly indicates that the current amplitude of the lateral transistor of the present invention increased 2 to 3 times over that of the conventional type. FIG. 5 distinctly shows that the cutoff frequency of a lateral transistor produced by the present invention was about 10 times higher than that of the conventional lateral transistor. Further, the lateral transistor of the present invention has the merit that it occupies an area about 20 to 25% reduced from that of the conventional lateral transistor.

What is claimed is:

1. A method of manufacturing a lateral transistor comprising the steps of:

providing a semiconductor body of a first conductivity type;

forming at least one annular pattern above a main surface of said semiconductor body;

implanting an impurity of a second conductivity type in said semiconductor body using said pattern as a mask to form a first region of a second conductivity type in self-aligned fashion with respect to said annular pattern facing an inner peripheral wall of said annular pattern and a second region of a second conductivity type in self-aligned fashion with respect to said annular pattern facing an outer peripheral wall of said annular pattern;

depositing at least one insulation layer on the resultant structure, with said annular pattern being retained;

etching said insulation layer to form a contact hole and, after said contact hole reaches said annular pattern, etching said insulation layer using said annular pattern as a mask to form in self-aligned fashion a contact hole reaching said first layer; and forming an electrode terminal in contact with said first region of said second conductivity type through said contact hole.

2. The method of manufacturing a lateral transistor according to claim 1, which further comprises the steps of:

forming at least one first insulation layer having an opening on the main surface of semiconductor body;

depositing a second insulation layer thinner than said first insulation layer on a portion of said semiconductor body facing said opening;

forming said annular pattern on said second insulation layer at a predetermined distance from said first insulation layer;

forming said first layer on a portion of said semiconductor body which faces a hollow area of said annular pattern;

forming said second layer between the outer peripheral wall of said annular pattern and the inner peripheral wall of said first insulation layer; and etching said second insulating layer to form said contact hole therein using said pattern as a mask.

3. The method of manufacturing a lateral transistor according to claim 1, wherein said annular pattern is prepared from a material which can be etched at a greater rate per unit of time than said insulation layer.

4. The method of manufacturing a lateral transistor according to claim 1, wherein said annular pattern is prepared from polycrystalline silicon.

5. The method of manufacturing a lateral transistor according to claim 1, wherein said annular pattern is prepared from silicon nitride.

6. The method of manufacturing a lateral transistor according to claim 1, wherein said annular pattern is prepared from metal silicide.

7. The method of manufacturing a lateral transistor according to claim 1, wherein said annular pattern is prepared from a polycide representing a composite body comprising metal silicide and polycrystalline silicon.

8. The method of manufacturing a lateral transistor according to claim 1, wherein said annular pattern is formed of a conductive material, and said electrode terminal is electrically connected to said annular pattern.

9. A method of manufacturing a lateral transistor comprising the steps of:

providing a semiconductor body of a first conductivity type;

forming at least one conductive annular pattern having a hollow area above a main surface of said semiconductor body;

implanting an impurity of a second conductivity type in said semiconductor body using said pattern as a mask to form a first region of a second conductivity type in self-aligned fashion with respect to an inner peripheral wall of said annular pattern and a second region of second conductivity type in self-aligned fashion with respect to an outer peripheral wall of said annular pattern;

depositing at least one insulating layer on the resultant structure, with said annular pattern being retained;

etching said insulating layer to form a contact hole reaching said annular pattern within the outer peripheral wall of said annular pattern and, after said contact hole reaches said annular pattern, etching said insulating layer with said hollow area of said annular pattern using said annular pattern as a mask to form a contact hole in said hollow area extending from a surface of said insulating layer to said first region; and forming an electrode terminal in contact with said first region of said second conductivity type and said annular pattern through said contact hole.

10. The method of manufacturing a lateral transistor according to claim 9, which further comprises the steps of:

forming at least one first insulating layer having an opening on the main surface of the semiconductor body;

depositing a second insulating layer thinner than said first insulating layer on a portion of said semiconductor body facing said opening;

forming said annular pattern on said second insulating layer at a predetermined distance from said first insulating layer; and etching said second insulating layer to form said contact hole therein using said annular pattern as a mask.

11. The method of manufacturing a lateral transistor according to claim 9, wherein said annular pattern is composed of at least one of silicides and polycides.

12. The method of manufacturing a lateral transistor according to claim 9, wherein said annular pattern is composed of one of molybdenum silicide, platinum silicide, palladium silicide, a polycide which is a combination of metal silicide and polycrystal silicon.

13. The method of manufacturing a lateral transistor according to claim 9, wherein a process for preparing said semiconductor body is composed of a step of preparing a semiconductor substrate of the second conductivity type and a step of growing a semiconductor body layer of the first conductivity type on said semiconductor substrate.

14. A method of manufacturing a lateral transistor comprising the steps of:

providing a semiconductor body having a semiconductor substrate of a second conductivity type, a semiconductor layer of a first conductivity type formed on said semiconductor substrate, and an embedded semiconductor layer of a first conductivity type, having a higher impurity concentration than that of said semiconductor layer, which is positioned between said semiconductor layer and the substrate;

forming at least one annular pattern above a main surface of said semiconductor body;

implanting an impurity of a second conductivity type in said semiconductor body using said pattern as a mask to form a first region of a second conductivity type facing a hollow area of said annular pattern and a second region of a second conductivity type in self-aligned fashion with respect to an outer peripheral wall of said annular pattern;

depositing at least one insulating layer on the resultant structure, with said annular pattern being retained; and forming a contact hole in said insulating layer reaching said annular pattern within the outer peripheral wall of said annular pattern and, after said contact hole has reached said annular pattern, etching said insulating layer using sad annular pattern s a mask to form a contact hole extending from a surface of said insulating layer to said first region; and forming an electrode terminal in contact with said first region of said second conductivity type through said contact hole.

15. The method of manufacturing a lateral transistor according to claim 11, which further comprises the steps of:

forming at least one first insulating layer having an opening on the main surface of the semiconductor body;

depositing a second insulating layer thinner than said first insulating layer on a portion of said semiconductor body facing said opening;

forming said annular pattern on said second insulating layer at a predetermined distance from said first insulating layer;

forming said first layer on a portion of said semiconductor body which faces a hollow area of said annular pattern and said second layer between the outer peripheral wall of said annular pattern and an inner peripheral wall of said first insulating layer; and etching said second insulating layer to form said contact hole therein using said pattern as a mask.

16. The method of manufacturing a lateral transistor according to claim 12, wherein said annular pattern is a conductivity pattern, and the step for forming said electrodes includes the step for connecting the electrodes directly to said annular pattern.

17. The method of manufacturing a lateral transistor according to claim 16, wherein said annular pattern is composed of at least one of silicides and polycides.

18. A method of making a lateral bipolar transistor comprising:

growing a semiconductor layer of a first type of conductivity on a semiconductor substrate;

depositing a layer of insulator over the semiconductor layer;

depositing a first conducting layer onto the insulator;

patterning the first layer so that it overlies a base and between an emitter and collector forming region; and implanting emitter and collector regions of the second type of conductivity into said semiconductor layer wherein the first layer closes on itself, said emitter and collector implantations are self-aligned to said first layer and said implanted emitter region is in the form of a band enclosing an unimplanted central region when viewed in plan.

* * * * *

UNITED STATES PATENT AND TRADEMARK OFFICE
CERTIFICATE OF CORRECTION

PATENT NO. :  4,985,367
DATED      :  January 15, 1991
INVENTOR(S) : Hideki Takada It is certified that error appears in the above-identified patent and that said Letters Patent is hereby corrected as shown below:

Claim 8, Column 7, Line 24, "laterial" should be --lateral--;

Claim 14, Column 8, Line 49, "sad annular pattern s" should be --said annular pattern as--.

Signed and Sealed this

Seventeenth Day of November, 1992

Attest:

DOUGLAS B. COMER

*Attesting Officer*     Acting Commissioner of Patents and Trademarks